United States Patent
Sanz-Robinson et al.

(10) Patent No.: US 11,947,756 B2
(45) Date of Patent: Apr. 2, 2024

(54) SENSOR SIGNAL CORRECTION

(71) Applicant: Cirrus Logic International Semiconductor Ltd., Edinburgh (GB)

(72) Inventors: Josh Sanz-Robinson, Austin, TX (US); Siddharth Maru, Austin, TX (US); Tejasvi Das, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 17/968,565

(22) Filed: Oct. 18, 2022

(65) Prior Publication Data
US 2023/0043516 A1    Feb. 9, 2023

Related U.S. Application Data

(63) Continuation of application No. 17/097,384, filed on Nov. 13, 2020, now Pat. No. 11,520,436.

(51) Int. Cl.
| | | |
|---|---|---|
| *G06F 3/041* | (2006.01) | |
| *G06F 3/02* | (2006.01) | |
| *G06F 3/01* | (2006.01) | |

(52) U.S. Cl.
CPC .............. *G06F 3/0418* (2013.01); *G06F 3/02* (2013.01); *G06F 3/0414* (2013.01); *G06F 3/016* (2013.01)

(58) Field of Classification Search
CPC .................................................... G06F 3/0414
See application file for complete search history.

(56) References Cited

U.S. PATENT DOCUMENTS

| | | |
|---|---|---|
| 7,047,818 B2 | 5/2006 | Dallenbach et al. |
| 2003/0214486 A1* | 11/2003 | Roberts ............... G06F 3/04142 345/173 |
| 2006/0293864 A1 | 12/2006 | Soss |
| 2009/0015579 A1 | 1/2009 | Nachman et al. |
| 2012/0266648 A1 | 10/2012 | Berme et al. |
| 2013/0229380 A1 | 9/2013 | Lutz, III et al. |
| 2016/0313205 A1 | 10/2016 | Gowreesunker et al. |
| 2017/0249049 A1 | 8/2017 | Wang et al. |
| 2018/0024015 A1 | 1/2018 | Berme et al. |
| 2018/0067601 A1 | 3/2018 | Winokur et al. |
| 2018/0088702 A1 | 3/2018 | Shutzberg et al. |
| 2018/0260066 A1 | 9/2018 | Chen et al. |
| 2020/0133455 A1* | 4/2020 | Sepehr .................. G06F 3/0488 |
| 2022/0171495 A1* | 6/2022 | Yamamoto .......... G06F 3/04144 |

FOREIGN PATENT DOCUMENTS

CN    105865702 A    8/2016

OTHER PUBLICATIONS

Combined Search and Examination Report under Sections 17 and 18(3), UKIPO, Application No. GB2116066.8, dated Apr. 28, 2022.

\* cited by examiner

*Primary Examiner* — Sanjiv D. Patel
(74) *Attorney, Agent, or Firm* — Jackson Walker L.L.P.

(57) ABSTRACT

A correction unit for use in a sensor system, the sensor system comprising a force sensor configured to output a sensor signal indicative of a temporary mechanical distortion of a material under an applied force, the correction unit configured, based on the sensor signal, to: estimate an effect of the applied force on how the material will return towards an undistorted form upon a substantial reduction or removal of the applied force; and generate a corrected signal based on the estimation.

16 Claims, 11 Drawing Sheets

SENSOR SIGNAL CORRECTION

The present disclosure is a continuation of U.S. Non-Provisional patent application Ser. No. 17/097,384, filed Nov. 13, 2020, which is incorporated by reference herein in its entirety.

FIELD OF DISCLOSURE

The present disclosure relates in general to force sensors and sensor systems which comprise a force sensor, and in particular to the correction of sensor signals provided by such force sensors.

A correction unit may be provided for use in such a sensor system to correct a sensor signal provided by a force sensor.

BACKGROUND

Force sensors and sensor systems having force sensors may be provided for use with, or as part of, a host device. A host device having a force sensor may be referred to as a sensor system or force sensor system.

In this context, a host device may be considered an electrical or electronic device and may be a mobile device. Example devices include a portable and/or battery powered host device such as a mobile telephone, an audio player, a video player, a PDA, a mobile computing platform such as a laptop computer or tablet and/or a games device.

In general, a force sensor is configured to output a sensor signal indicative of a temporary mechanical distortion of a material under an applied force. The material may for example be a metal plate which is part of, or associated with, the force sensor, and which is pushed/pressed or otherwise deformed by a user. In the context of a host device, the material may be part of a chassis or external casing of the device. The force may for example be applied and subsequently reduced or removed in a user press operation, where the force sensor is used to implement a button, the user press operation starting when the force is applied.

Force sensing may be carried out by a variety of different types of force sensor. Example types of force sensor mentioned above include capacitive displacement sensors, inductive force sensors, strain gauges, piezoelectric force sensors, force sensing resistors, piezoresistive force sensors, thin film force sensors and quantum tunnelling composite-based force sensors.

An example involving inductive sensing (e.g. employing a resistive-inductive-capacitive sensor) will now be considered, by way of example. In particular, an example inductive sensor system (sense system) 1000 is shown in FIG. 1. This inductive sensing example will be taken forward as a running example, however it will be appreciated that the considerations apply equally to other types of sensor system. The present disclosure will be understood accordingly.

In FIG. 1, the inductive sensor system 1000 is shown in schematic form on the left-hand side, and as an equivalent lumped (circuit) model on the right-hand side. The inductive sensor (force sensor) in this example comprises a metal plate 1002 and inductor 1004 located at a certain distance. When current (I) goes through the inductor 1004, the magnetic field induces an Eddy current inside the metal plate 1002. When a force is applied to the metal plate 1002, this deforms or deflects the metal plate and changes the distance from the metal plate 1002 to the inductor coil 1004. This in turn changes the coupling between the inductor 1004 and metal plate 1002, and the coupling coefficient k, inductance L2 and lossy resistance RL from the model change. The change in distance, in turn, modifies the effective impedance looking into the inductor (ZL).

In such an inductive sensor system 1000, a mechanical movement/distortion in the metal plate 1002 under the applied force will result in a change in inductance. This can be used to implement a button for example at the surface or shell/casing/chassis of a host device (e.g. with the metal plate forming part of the chassis). FIG. 2 is a schematic diagram showing such an implementation, where the inductor/coil is shown implemented as a PCB inductor located alongside a metal chassis of the host device which serves as the metal plate. As indicated, the application of a force on the metal chassis by a user's finger causes a displacement or deflection of the metal chassis, which affects the distance to the coil. A measurement unit is provided to measure the change in impedance looking into the inductor.

A more detailed example sensor system 1100, which measures a phase shift that is proportional to the coil inductance, is shown in FIG. 3 and may be considered a detailed implementation of the systems of FIGS. 1 and 2.

With reference to FIG. 3, the example system 1100 comprises a digitally controlled oscillator (DCO) 1110, a drive circuit (Driver) 1120, a force sensor (Sensor) 1130, a Q-I receive path 1140, a processing block (phase calculator) 1150 and a button press detection block (input determination block) 1160.

The DCO 1110 outputs a clock at a carrier frequency (Fc), referred to as the 0 degree output. The DCO 1110 outputs a second square wave clock that is notionally 90 degrees shifted relative to the primary output, referred to as the 90 degree output.

The output of the VCO (DCO) is coupled to the input of the driver 1120. The drive circuit 1120 drives a pseudo-sinusoidal current at the frequency and phase alignment of the 0 degree clock input. The drive circuit 1120 drives a fixed amplitude current.

The sensor (Sensor) 1130 in this example comprises an R-L-C circuit (corresponding to the sensor shown in FIGS. 1 and 2), and may be referred to as a resistive-inductive-capacitive sensor. The inductance in the circuit is comprised of a coil and a metal plate, for example the coil 1004 and the metal plate 1002. The voltage across the sensor 1130 is generated based on the R-L-C filter response to the current driven onto the sensor (alternatively the system may be responsive to voltage driven onto the sensor, to generate a current to be measured). The R component is not shown in FIG. 3 but will be present as an intentional or parasitic circuit component.

The Q-I receive path 1140 receives the voltage across the sensor 1130 and comprises a low noise input amplifier (Amplifier) 1141, an I path and a Q path. The Q path is coupled to the output of the amplifier 1141 and comprises an analog multiplier 1142 with inputs coupled to the VCO (DCO) output that is 90 degrees phase shifted to the current transmitted by the driver circuit 1120 and the output of the amplifier 1141, a low-pass filter 1143 coupled to the output of the analog multiplier 1142, and an ADC 1144 coupled to the output of the low pass filter 1143 to digitize the Q path voltage signal. The I path is coupled to the output of the amplifier 1141 and comprises an analog multiplier 1145 with inputs coupled to the VCO (DCO) output that is phase aligned to the current transmitted by the driver circuit 1120 and the output of the amplifier 1141, a low-pass filter 1146 coupled to the output of the analog multiplier 1145, and an ADC 1147 coupled to the output of the low pass filter 1146 to digitize the I path voltage signal.

The processing block (phase calculator) 1150 generates amplitude and phase information from the Q-I paths wherein, the I path ADC output is coupled as an input into the processing block 1150, and the Q path ADC output is coupled as an input into the processing block 1150.

In such a system 1100, to do one scan of the R-L-C sensor 1130, the VCO (DCO) 1110 and drive circuit 1120 are activated. After the low pass filter 1143, 1146 has settled, the ADC 1144, 1147 is activated and one or multiple ADC samples are captured, nominally at 500 kHz (as an example). The duration over which the ADC samples are captured is referred to as the conversion time.

The button press detection block (input determination block) 1160 observes the phase information to determine if the shift in phase recorded by the I-Q detection path 1140 is interpreted as a button press. In this regard, an output signal of the processing block 1150 which contains the phase information may be referred to as a sensor signal which is operated upon by the button press detection block 1160. The output of the button press detection block 1160 may be a button_on_off signal which indicates whether the button implemented by the sensor 1130 is being pressed (ON) or not (OFF).

However, such systems are considered to be open to improvement when performance is taken into account. In particular, it has been found that output of the button press detection block 1160 may be inaccurate or subject to errors.

It is desirable to provide improved sensor systems, in which performance reaches acceptable levels.

SUMMARY

According to a first aspect of the present disclosure, there is provided a correction unit for use in a sensor system, the sensor system comprising a force sensor configured to output a sensor signal indicative of a temporary mechanical distortion of a material under an applied force, the correction unit configured, based on the sensor signal, to: estimate an effect of the applied force on how the material will return towards an undistorted form upon a substantial reduction or removal of the applied force; and generate a corrected signal based on the estimation.

In this way, the corrected signal better represents the applied force than the sensor signal, since the effect of the applied force on how the material will return towards its undistorted form upon a substantial reduction or removal of the applied force has been taken into account.

The effect may comprise a mechanical effect, or a mechanical-relaxation effect, affecting how the material will return towards (or to) the undistorted form.

The effect may be estimated based on a definition of a mechanical model which models a mechanical interaction between the material and the applied force. The sensor signal may represent the applied force. The corrected signal may be generated by correcting the sensor signal based on the estimation. The corrected signal may better represent the applied force than the sensor signal, for example when that applied force is applied and/or when (or as) that applied force is substantially reduced or removed.

The correction unit may be configured, based on the sensor signal, to: calculate an estimation signal which estimates the effect and/or which comprises said estimation; and generate the corrected signal based on the estimation signal.

The force may be applied and subsequently reduced or removed in a user press operation, the user press operation starting when the force is detected as having been applied.

The correction unit may be configured, based on the sensor signal, to detect the start of the user press operation, optionally by comparing the sensor signal (e.g. its magnitude or gradient) to a threshold value.

The correction unit may be configured to calculate the estimation signal using an estimation model whose arguments comprise one or more input variables. The one or more input variables may comprise one or more of: time; an elapsed time (or duration) of the user press operation; a magnitude of the sensor signal, e.g. over the user press operation; a rate of change of the magnitude of the sensor signal; a period of time since a previous user press operation; a frequency of user press operations; a determined location of the applied force relative to a location of the force sensor; a time-domain and/or frequency-domain feature extracted from the sensor signal and/or the corrected signal; a time-domain and/or frequency-domain feature extracted from, or a magnitude of at least one sensor signal obtained from another force sensor of the sensor system; a time-domain and/or frequency-domain feature extracted from, or a magnitude of at least one sensor signal obtained from another sensor of the sensor system (other than a force sensor) such as a temperature sensor, accelerometer, microphone or camera; a feedback signal generated by the sensor system in response to the sensor signal and/or the corrected signal; and a feedback signal input by a user in response to the sensor signal and/or the corrected signal. Such variables may be provided as time-based or time-series signals, and be considered e.g. functions of time.

The estimation model may be configured such that the estimation signal is related to or proportional to: the elapsed time of the user press operation; and/or the magnitude of the sensor signal, e.g. over the user press operation. Such a magnitude may be provided as a time-based or time-series signal, and be considered e.g. a function of time.

The estimation model may be or comprises an estimation function, such as an exponential function. The estimation model may be or comprise a (trained) machine-learning model.

The correction unit may be configured, based on the sensor signal, to calculate the estimation signal based on:

$$B(t) = F(t)\left(1 - \exp^{\frac{-t_E}{T_0}}\right)$$

where t is time, $t_E$ is the elapsed time, $B(t)$ is the estimation signal, $F(t)$ is the sensor signal, and $T_0$ is a time-constant factor. The correction unit may be configured to adapt the time-constant factor $T_0$ based on one or more of the above input variables.

The correction unit may be configured, based on the sensor signal, to calculate the estimation signal based on a weighted sum or other mathematical combination of the sensor signal and the at least one sensor signal obtained from another force sensor of the sensor system.

The correction unit may be configured, based on the sensor signal, to calculate the estimation signal based on a weighted sum or other mathematical combination of the sensor signal and the at least one sensor signal obtained from another sensor of the sensor system (other than a force sensor) such as a temperature sensor, accelerometer, microphone or camera.

The correction unit may be configured to generate the corrected signal by subtracting the estimation signal from the sensor signal, optionally wherein the estimation signal is an estimated baseline signal.

The correction unit may be configured, based on a determinative magnitude being a magnitude of the sensor signal or the corrected signal, to calculate a compensation signal as: when the determinative magnitude is above a first threshold, the estimation signal; when the determinative magnitude is below a second threshold, the sensor signal; and/or when the determinative magnitude is between the first and second thresholds, a weighted sum of the sensor signal and the estimation signal dependent on a position of the determinative magnitude between the first and second thresholds. The correction unit may be configured to generate the corrected signal by subtracting the compensation signal from the sensor signal, optionally wherein the compensation signal is an estimated baseline signal.

The sensor signal (and other signals described herein) may comprise a time series of samples. The correction unit may be configured to calculate the estimation signal and/or the correction signal on a sample-by-sample basis, optionally in an iterative manner (i.e. by updating a previous or preceding value of that signal).

The mechanical distortion may comprise one or more of a mechanical deformation, an elastic deformation and a mechanical deflection. The force may be a distorting force. The material may be part of the force sensor or be associated with or provided adjacent to the force sensor.

According to a second aspect of the present disclosure, there is provided a correction unit for use in a sensor system, the system comprising a force sensor configured to output a sensor signal indicative of an applied force, the correction unit configured, based on the sensor signal, to: calculate or estimate a mechanical-relaxation (e.g. baseline) signal representative of a mechanical-relaxation effect on the sensor signal in response to the applied force; and generate a mechanical-relaxation-compensated corrected signal based on the mechanical-relaxation (e.g. baseline) signal and the sensor signal, for example by subtracting the mechanical-relaxation (e.g. baseline signal) from the sensor signal.

According to a third aspect of the present disclosure, there is provided a correction unit for use in a sensor system, the system comprising a force sensor configured to output a sensor signal indicative of a temporary mechanical distortion of a material under an applied force, the correction unit configured, based on the sensor signal, to: estimate an effect of the applied force on the material; and generate a corrected signal based on the estimation.

According to a fourth aspect of the present disclosure, there is provided a correction unit for use in a sensor system, the system comprising a force sensor configured to output a sensor signal indicative of an applied force, wherein: the correction unit is configured, based on the sensor signal, to estimate a compensation signal which, if subtracted from the sensor signal, provides a corrected signal which better represents the applied force than the sensor signal, for example during a substantial reduction or removal of that applied force.

According to a fifth aspect of the present disclosure, there is provided a correction unit for use in a sensor system, the system comprising a force sensor configured to output a sensor signal indicative of an applied force, wherein: the correction unit is configured, based on the sensor signal, to generate a corrected signal which better represents the applied force than the sensor signal, e.g. when or as that applied force is substantially reduced or removed.

According to a sixth aspect of the present disclosure, there is provided correction unit for use in a sensor system, the system comprising a force sensor configured to output a sensor signal indicative of an applied force, wherein the force is applied and subsequently reduced or removed in a user press operation, the user press operation starting when the force is applied, and wherein the correction unit is configured, based on the sensor signal, to:

calculate an estimation signal based on:

$$B(t) = F(t)\left(1 - e^{\frac{-t_E}{T_0}}\right)$$

where t is time, $t_E$ is an elapsed time of the user press operation, B(t) is the estimation signal, F(t) is the sensor signal, and $T_0$ is a time-constant factor; and generate a corrected signal based on the estimation signal.

According to a seventh aspect of the present disclosure, there is provided correction unit for use in a sensor system, the system comprising a force sensor configured to output a sensor signal indicative of an applied force, the correction unit configured, based on the sensor signal, to: calculate a mechanical-model (e.g. baseline) signal representative of an effect of a mechanical operation of the force sensor on the sensor signal in response to the applied force; and generate a mechanical-model-compensated corrected signal based on the mechanical-model (e.g. baseline) signal and the sensor signal, for example by subtracting the mechanical-model (e.g. baseline signal) from the sensor signal.

According to an eighth aspect of the present disclosure, there is provided a sensor system, comprising: the correction unit according to any of the aforementioned aspects; and the force sensor.

According to a ninth aspect of the present disclosure, there is provided a host device, comprising the correction unit according to any of the aforementioned first to seventh aspects or the sensor system according to any of the aforementioned eighth aspect.

Also envisaged are corresponding method aspects, computer program aspects and storage medium aspects. Features of one aspect may be applied to another and vice versa.

BRIEF DESCRIPTION OF THE DRAWINGS

Reference will now be made, by way of example only, to the accompanying drawings, of which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Before considering embodiments, focus will be placed on sources of inaccuracy. In particular, focus will be placed on sensor signals provided by force sensors, such as the output signal of the processing block 1150 of FIG. 3.

Figure 3:
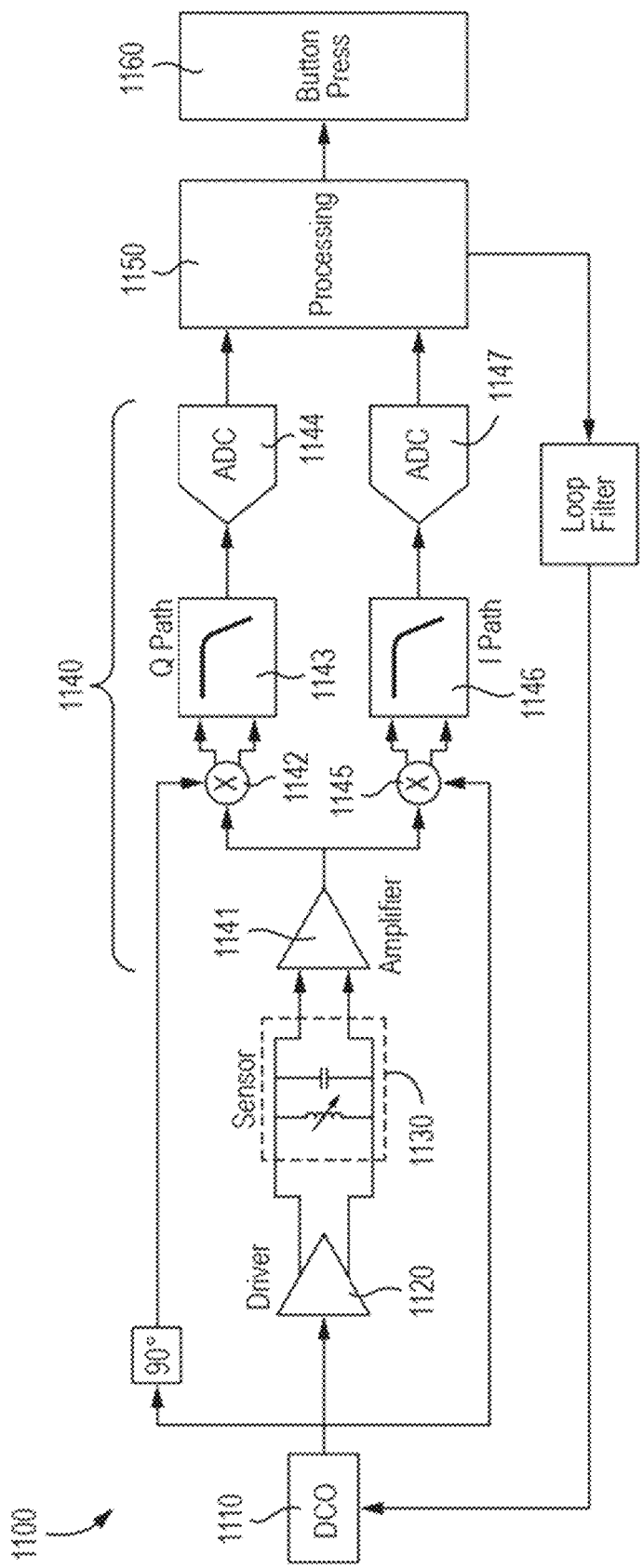
FIG. 3, mentioned above, is a schematic diagram of an example previously-considered inductive sensor system.
Figure 4:
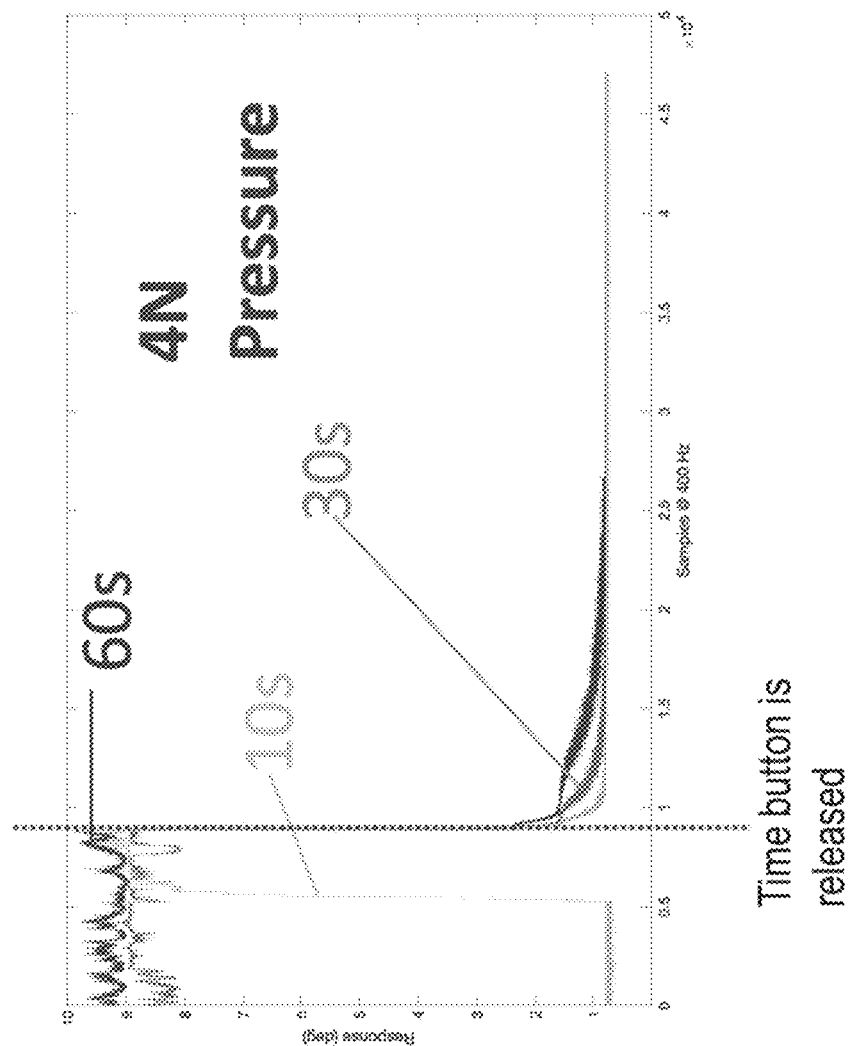
FIG. 4 is a graph which shows three example sensor signals.

FIG. 4 is a graph which shows three example sensor signals, marked 10 s, 30 s and 60 s, respectively, as might be output from the processing block 1150 of FIG. 3. As such, the sensor signals as shown as phase responses (in degrees) against time (indicated by way of sample numbers, where the samples are obtained at 400 Hz as an example).

In this example, the same sensor (button) was pressed for 10 seconds, 30 seconds, and 60 seconds, thereby providing the 10 s, 30 s and 60 s sensors signals, respectively. As indicated in FIG. 4, the sensor signals have been aligned in time so that the time when the button was released (i.e. the applied force was removed) is the same across all three signals.

As apparent from FIG. 4, the button does not behave as an "ideal" button. When the button is released after being pressed, i.e. when the applied force is removed, the sensor signals take some time to return to their original "non-pressed" baseline level, and this differs for the three signals shown. Effectively, the sensor signals are each indicative of a temporary mechanical distortion of a material (of or associated with the force sensor) under an applied force, in this case of the metal plate being pressed by the user (see FIGS. 1 and 2). When that applied force is removed (or substantially reduced), the material returns to (towards) an undistorted or 'at rest' form.

This return to an undistorted form may be considered a manifestation of a mechanical relaxation effect associated with the mechanical construction of the force sensor, in this example related to the temporary mechanical distortion or deflection of the metal plate. A deflection in this context is the degree to which the material (or a part or structural element thereof) is displaced under a load (due to its deformation), and may refer to an angle or a distance. The extent of this mechanical relaxation effect depends on, for example, the duration and frequency of the button press, the force of the button press and the position of the button press. Hence, in FIG. 4, the three sensor signals (between which the duration of the button presses differs) show different returns to baseline level. The position of the button press may for example be deduced or determined based on sensor signals from multiple force sensors at known locations, for example.

These mechanical relaxation effects thus manifest themselves in inaccuracies in the sensor signals; the magnitude of the applied force, and the timing of its release, is the same for each of the sensor signals in FIG. 4 and thus the three sensor signals would all return to their baseline level in the same way in an 'ideal' case. However, the 60 s sensor signal takes the longest to return to its baseline level whereas the 10 s sensor signal is the quickest. These inaccuracies in the sensor signals pass through to inaccuracies in the output of a button press detection algorithm, as may be employed by the button press detection 1160.

Figure 5:
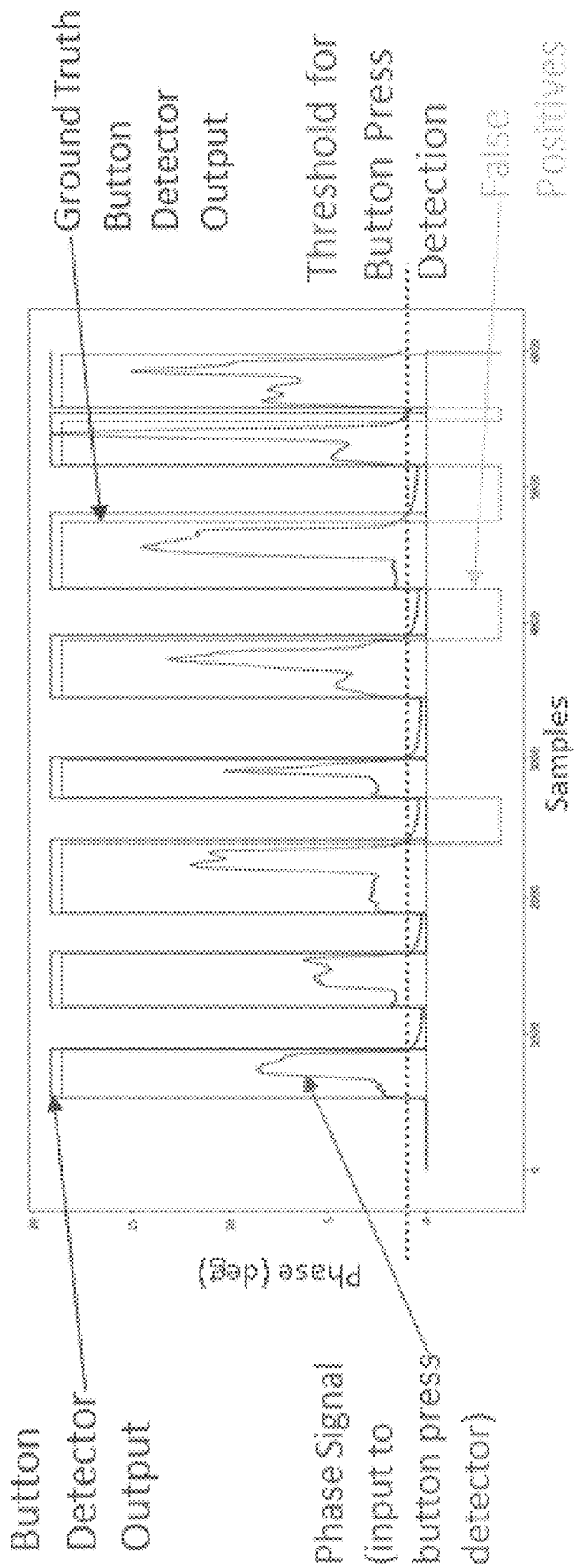
FIG. 5 is a graph useful for understanding problems with press detection.

FIG. 5 is a graph which shows an example sensor signal, marked Phase Signal, as might be output from the processing block 1150 of FIG. 3. As such, the sensor signal is shown as a phase response (in degrees) against time (indicated by way of sample numbers). Also plotted on the same graph are a threshold level (Threshold for Button Press Detection), a press detection output signal (Button Detector Output) and a ground truth press detection output signal (Ground Truth Button Detector Output).

It is assumed here that the button press detection algorithm operates by determining that the button is being pressed if the sensor signal is above the threshold level, e.g. which may be set at 1 degree phase assuming baseline phase to be at 0 degrees. Accordingly, the press detection output signal has a HIGH value (button ON) when the sensor signal is above the threshold level and a LOW value (button OFF) when the sensor signal is below the threshold level. The mechanical relaxation effect mentioned earlier affects when the sensor signal crosses the threshold level upon removal of the applied force (the pressing of the button). This can be appreciated by comparison of the press detection output signal with the ground truth press detection output signal, the latter of which is generated based on a hypothetical 'ideal' sensor signal (not shown) which crosses the threshold level exactly when the applied force is removed.

By comparison of the press detection output signal with the ground truth press detection output signal, it can be seen that the button press detection algorithm generates so-called false positives in those cases where the press detection output signal has a HIGH value (button ON) for a substantial period of time after the ground truth press detection output signal falls from HIGH to LOW. That is, false positives occur when the user stops pressing the button, but due to mechanical relaxation it takes additional time for the button press to be detected as having been released. These cases are indicated by another signal overlaid below the x-axis on the graph as indicated. Note that a "false positive" is defined here relative to an "event". In this case, the event consists of the period of time during which the button should be OFF. If at some point during this time period the button is incorrectly detected as ON, the entire event (and associated time period) is taken as a false positive.

Figure 6:
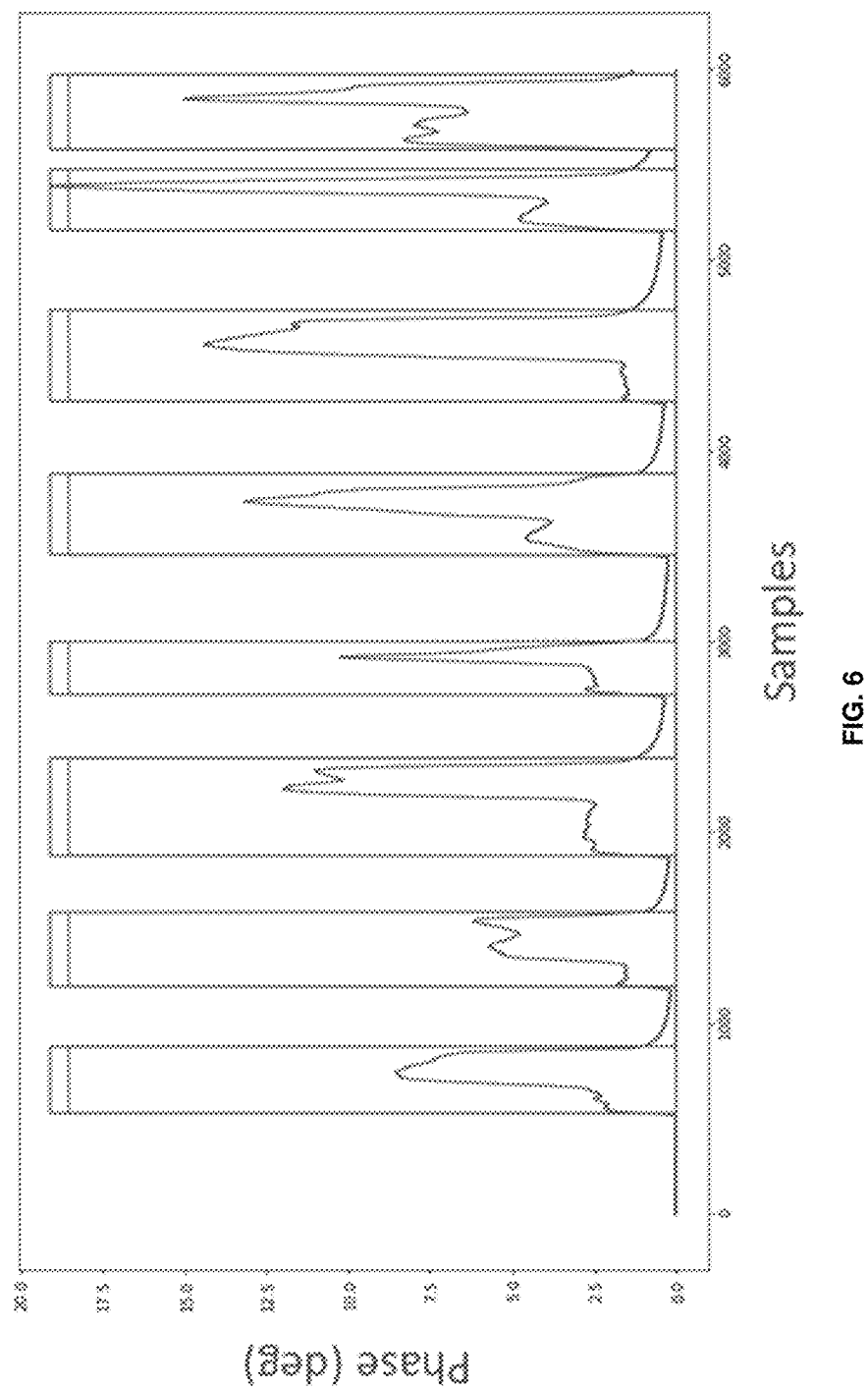
FIG. 6 is a graph useful for understanding press detection in an ideal case.

It would be desirable for the press detection output signal to better represent the actual application and removal of the force on the button (force sensor) and thus to more closely match the ground truth press detection output signal, for example as indicated in FIG. 6 which is a graph corresponding to FIG. 5 but with the press detection output signal matching the ground truth press detection output signal.

One way to address the mechanical relation effect is to focus on the force sensor itself, in terms of its construction and materials. The present inventors have however focused on the sensor signal itself, accepting the force sensor as being non-ideal in its operation and instead looking to 'correct' the sensor signal so that the mechanical relaxation effects are reduced, removed or compensated for.

Figure 7:
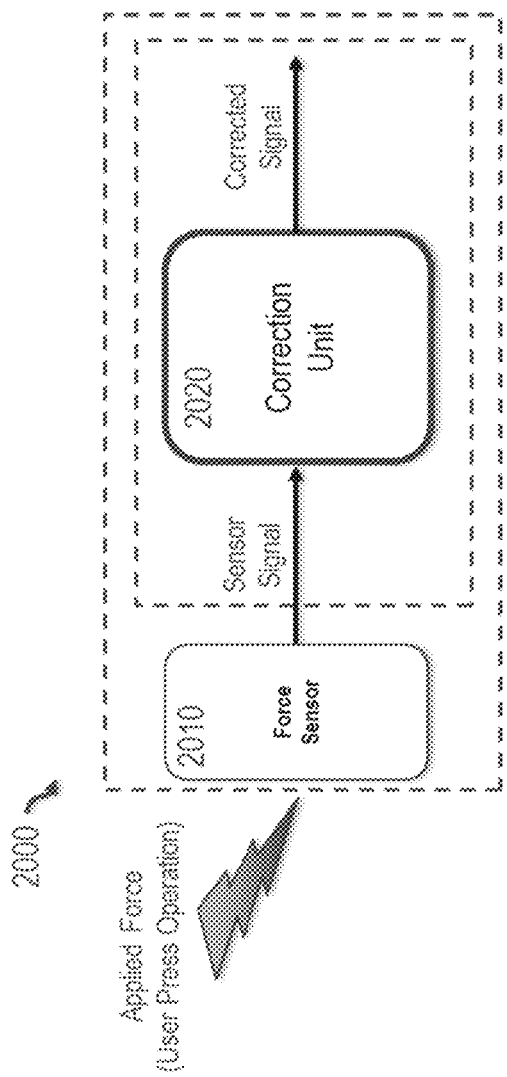
FIG. 7 is a schematic diagram of a sensor system embodying the present invention.

With this in mind, FIG. 7 is a schematic diagram of a sensor system 2000 embodying the present invention.

The sensor system 2000, as shown in FIG. 7, comprises a force sensor 2010 and a correction unit 2020. Of course, the sensor system 2000 may be provided as a host device as mentioned earlier, in which case it may comprise numerous other elements (not shown for simplicity). In some embodiments, the sensor system 2000 may be provided without the force sensor 2010, for use with the force sensor 2010 (e.g. as an external component). As such, the sensor system 2000 may be provided as indicated by either of the two dashed boxes in FIG. 7.

As above, the force sensor 2010 is configured to output a sensor signal indicative of a temporary mechanical distortion of a material under an applied force, for example applied in a user press operation. In a user press operation, the force may be applied and subsequently reduced or removed, corresponding to a (time limited) button press.

The correction unit 2020 is configured, based on the sensor signal, to generate a corrected signal which better represents the applied force than the sensor signal when that applied force is substantially reduced or removed. For example, looking back to FIG. 4, the corrected signal may be considered to more quickly return to the baseline level than any of the 10 s, 30 s and 60 s sensor signals, and/or to return to the baseline level with less dependence on how the force has been applied (e.g. its magnitude, its duration, etc.). Thus, the corrected signals corresponding to the 10 s, 30 s and 60 s sensor signals of FIG. 4 may be more similar to one another, in particular when or as (including after) the button has been released, than the 10 s, 30 s and 60 s sensor signals themselves.

Figure 8:
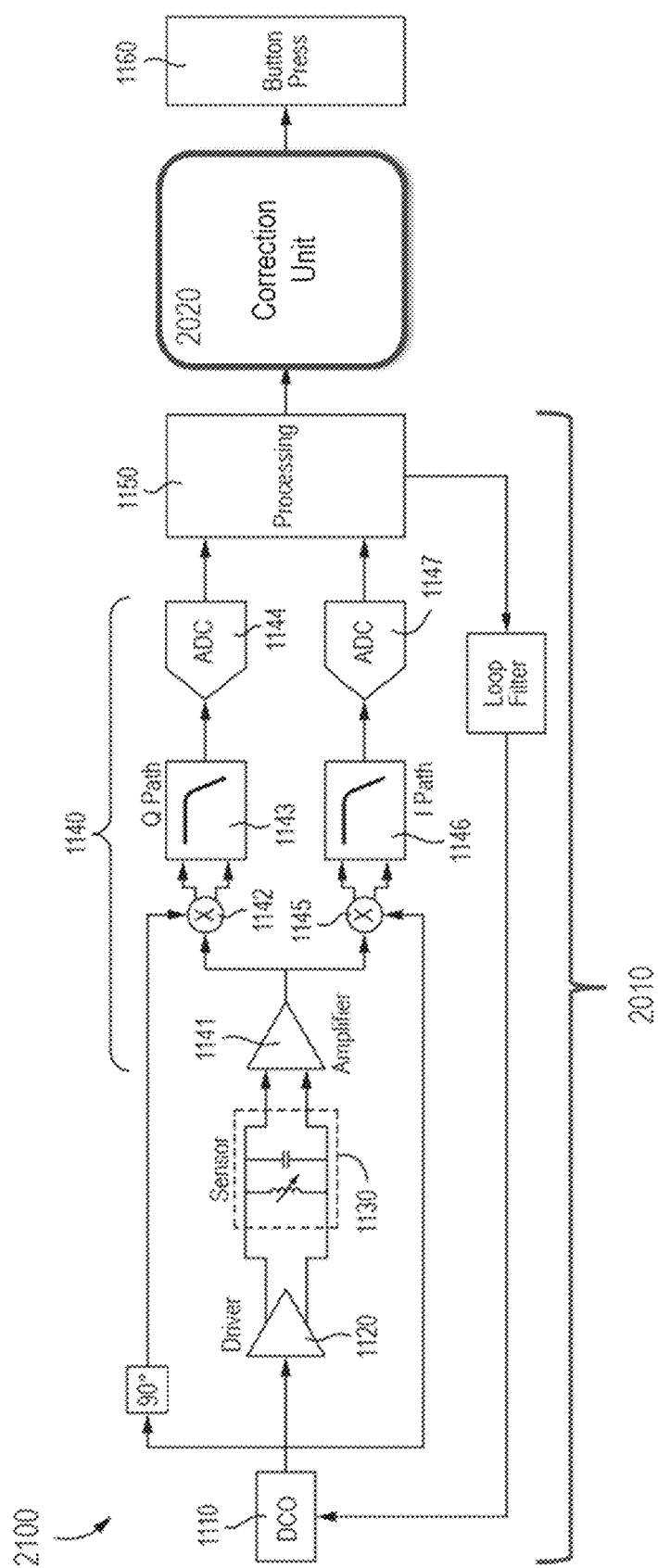
FIG. 8 is a schematic diagram of a sensor system embodying the present invention.

FIG. 8 is a schematic diagram of a sensor system 2100 embodying the present invention, as a detailed example. The sensor system 2100 corresponds to the sensor system 1100 of FIG. 3, but has the correction unit 2020 introduced between the processing block (phase calculator) 1150 and the button press detection block (input determination block) 1160. Thus, in FIG. 8 the button press detection block 1160 operates based on the corrected signal, rather than on the sensor signal as in FIG. 3. For comparison with FIG. 7, the elements in FIG. 8 which collectively generate the sensor signal have been indicated as corresponding to the force sensor 2010 in FIG. 7.

One way to generate the corrected signal is to calculate an estimation signal which estimates an effect of the applied force on how the material (e.g. metal plate) will return to or towards its undistorted form upon a substantial reduction or removal of the applied force, and then to generate the corrected signal based on the estimation signal. For example, the estimation signal may be generated as an estimated baseline signal with the corrected signal then being generated by subtracting the estimation signal from the sensor signal.

Figure 9:
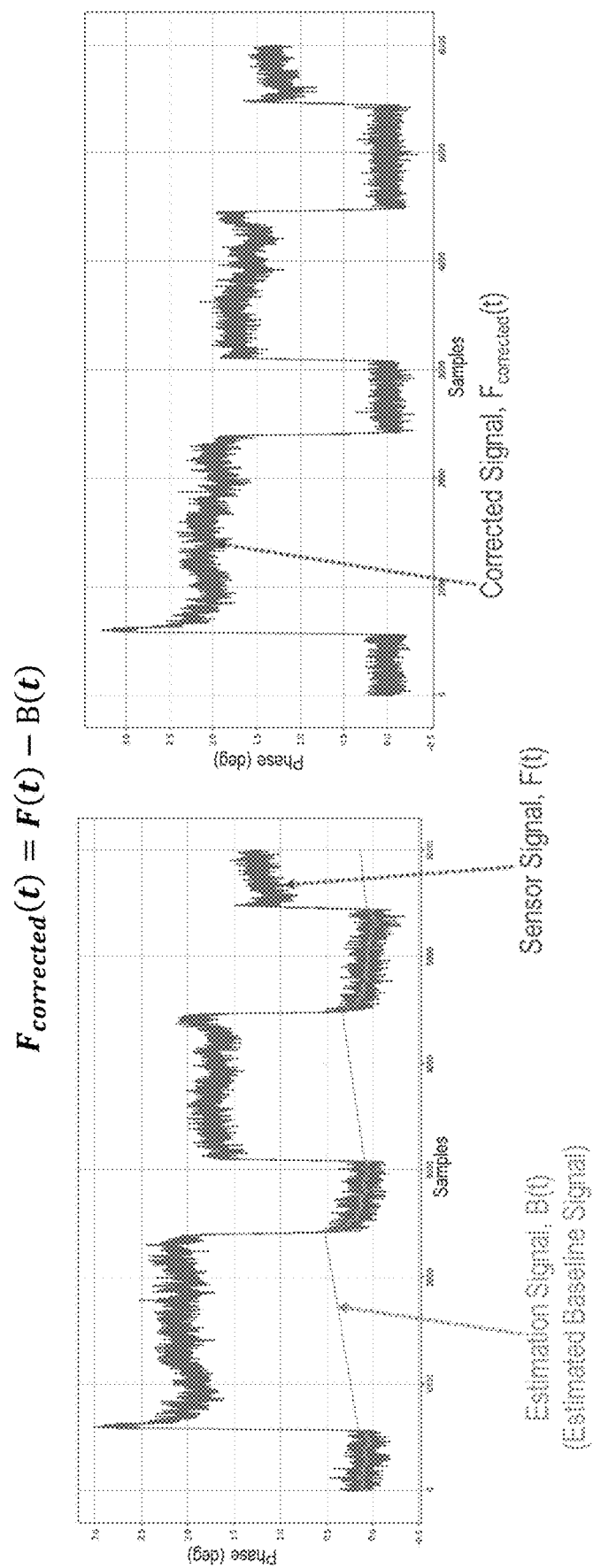
FIG. 9 presents graphs useful for understanding possible operation of the embodiments of FIGS. 7 and 8.

FIG. 9 presents two graphs to demonstrate how the corrected signal could be generated in this way.

The left-hand graph shows the sensor signal as a phase signal for consistency with the FIG. 8 example. As such, the sensor signal is shown as a phase response or phase signal (in degrees) against time (indicated by way of sample numbers). It is recalled that the sensor signal is obtained from the force sensor 2010 and as such is effectively a force signal (a signal whose magnitude is representative of, or proportional to, the detected force applied to the force sensor). For this reason, the sensor signal is labelled F(t), where t is time (e.g. measured in seconds or samples). Also shown on the left-hand graph is the estimation signal which estimates an effect of the applied force on how the material (e.g. metal plate) will return to or towards its undistorted form upon a substantial reduction or removal of the applied force. Here the estimation signal is generated as an estimated baseline signal, and as such is marked as B(t).

The right-hand graph shows the corresponding correction signal, $F_{corrected}(t)$ obtained by subtracting the estimation signal from the sensor signal, according to the equation:

$$F_{corrected}(t) = F(t) - B(t)$$

It can be seen from the left-hand graph that the estimated baseline signal, B(t), is calculated to rise during a user press operation with its value dependent on, or proportional to, the applied force and the elapsed time of the user press operation (i.e. its duration). The elapsed time of a user press operation may be measured from when that user press operation starts, this point being defined for example by when the sensor signal crosses or exceeds a threshold value as it rises from a value below the threshold value.

In this way, the longer the user press operation is, and the larger the applied force is, the less far the sensor signal needs to drop at the end of the user press operation to meet the estimated baseline signal. Therefore, as can be seen from the right-hand graph, the correction signal, $F_{corrected}(t)$, better resembles a square wave with the mechanical relaxation effects at the end of each user press operation substantially removed. That is, at the end of the user press operation, when the sensor signal value drops rapidly but with some inaccuracy due to the mechanical relaxation effects, the corresponding corrected signal drops substantially directly to its baseline level.

One possible way to calculate the estimation signal or estimated baseline signal, B(t), is using an estimation model, which is proportional to the force applied and the elapsed time of the user press operation. One possible model is an estimation function such as an exponential function, which may thus include variables such as the elapsed time of the user press operation, and the magnitude of the sensor signal over the user press operation.

An example of such exponential function is as follows:

$$B(t) = F(t)\left(1 - \exp\frac{-t_E}{T_0}\right)$$

where t is time, $t_E$ is the elapsed time of the user press operation, B(t) is the estimation signal, F(t) is the sensor signal, and $T_0$ is a time-constant factor. It will become apparent that this model or function may be implemented so that the estimation signal B(t) is updated sample by sample in an iterative manner, with the only time information needed being the sample period, so that it becomes unnecessary to explicitly measure $t_E$.

Such a function effectively serves as a mechanical model which models a mechanical interaction between the material (metal plate) and the applied force. In effect, the estimation signal may be based on a definition of such a mechanical model.

Of course, the above function is just an example and another function (e.g. another exponential function) may be used, such as one which also has further arguments. Examples of further arguments include variables such as the magnitude of a sensor signal obtained from at least one other force sensor of the system and/or at least one other sensor of the system such as a temperature sensor, accelerometer, microphone or camera. It is recalled that the sensor system may be, or be part of, a host device which may have multiple force sensors and/or sensors other than force sensors.

The above formula for the estimation signal, B(t), has the following derivative:

$$\frac{\partial B(t)}{\partial t} = \frac{\partial F(t)}{\partial t}\left(1 - \exp^{\frac{-t_E}{T_0}}\right) + \frac{F(t)}{T_0}\exp^{\frac{-t_E}{T_0}}$$

The estimation signal or estimated baseline signal, B(t), may thus be updated sample by sample in an iterative manner (as mentioned earlier), i.e. updated in real-time as each new sample of the sensor signal becomes available:

$$B(t+1) = B(t) + \frac{\partial B(t+1)}{\partial t}\Delta t$$

Here, B(t+1) becomes the value of the estimation signal for the sample after that for B(t), and t and $t_E$ in the above derivative effectively become the sample time/period so that it is no longer necessary to explicitly measure $t_E$ as mentioned earlier.

The time-constant factor, $T_0$, could be preset or could be adapted e.g. in real-time to adjust the rate/aggressivity of the baseline estimation. For example, the adaptation could be based on any of the above variables including features, including time and frequency domain, extracted from the sensor signal, F(t), for the sensor signal (i.e. force sensor or button) whose baseline is being estimated. As another example, the adaptation could be based on features, including time and frequency domain, extracted from the sensor signal from another button/force sensor different from that whose baseline is being estimated. As another example, the adaptation could be based on stimuli and associated features, including time and frequency domain, extracted from other sensors in the system, such as a temperature sensor, accelerometer, microphone or camera. As another example, the adaptation could be based on feedback gathered from a human user, who is interacting with a device (e.g. host device), such as a mobile phone or tablet, through a GUI, voice interface or other feedback mechanism.

In the present example, the (force) sensor system may thus be understood as providing a mechanical-relaxation-compensated corrected signal, using a (force) sensor signal and a baseline signal, the baseline signal subtracted from the sensor signal to provide the corrected output signal. The baseline signal may be adjusted based on (a) the applied force as determined from the force sensor signal, (b) the duration of the force as determined from the force sensor signal, and/or (c) a mechanical model of the force sensor system, to compensate for mechanical relaxation effects of the force sensor system.

The mechanical model of the sensor system may be dynamically adapted (e.g. by adapting the factor $T_0$) based on (a) features extracted from the force sensor signal e.g. time series variance over a time window, (b) features extracted from other force sensors, and/or (c) other types of sensor outputs, e.g. based on the temperature of the sensor system. The estimation signal (baseline signal) may be adjusted based on a previously-calculated iteration of the estimation signal or the corrected signal, to account for an SNR level of the system.

As mentioned above, the estimation signal may be calculated using a function which has arguments beyond the elapsed time of the user press operation, and the magnitude of the sensor signal (over the user press operation). One example of further arguments includes the magnitude of a sensor signal obtained from at least one other force sensor of the system.

Figure 10:
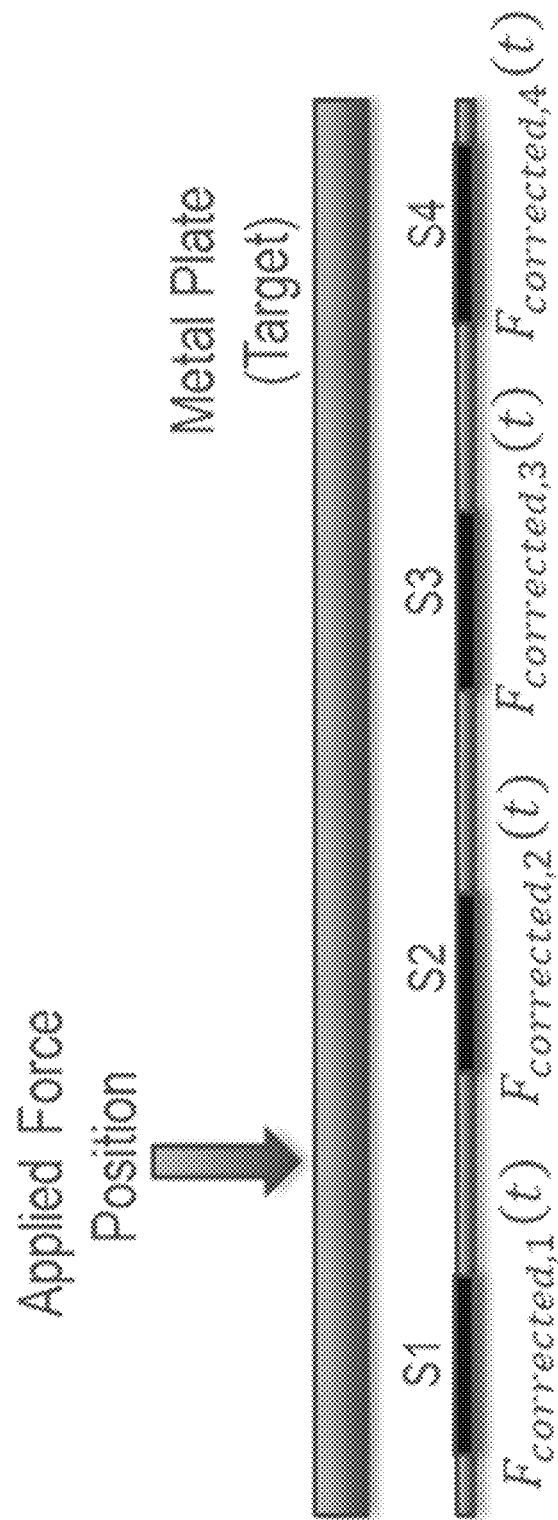
FIG. 10 is a schematic diagram of an example sensor system comprising four force sensors.

With this in mind, FIG. 10 is a schematic diagram of an example sensor system comprising four force sensors S1 to S4 which share the same metal plate (which may be part of the chassis or sidewall of a host device such as a smart phone). An applied force is shown at a location between force sensors S1 and S2, but it is appreciated that components of this force will be sensed at each of the sensors S1 to S4 due to the common metal plate.

For convenience, the four correlated sensors S1 to S4 may be assumed to generate or provide sensor signals $F_1(t)$ to $F_4(t)$, respectively. It may also be assumed that each of those sensor signals is subject to correction using the techniques described herein, so that respective estimation signals $B_1(t)$ to $B_4(t)$ are calculated and applied to their corresponding sensor signals to generated corrected signals $F_{corrected,1}(t)$ to $F_{corrected,4}(t)$, respectively.

Given the interaction between the sensors S1 to S4 due to the common metal plate, it may be advantageous to use the sensor signals for each of those sensors as arguments when calculating the estimation signal for one of them. For example, in the case of S4 its corrected signal may be represented as:

$$F_{corrected,4}(t) = F_4(t) - B_4(F_1(t), F_2(t), F_3(t), F_4(t))$$

In this case, since the force is being applied closer to S1 and S2, these two sensors have a larger signal. Using S1 and S2 to contribute to the estimation signal $B_4(t)$ at S4 exploits the higher SNR of S1 and S2 to improve $B_4(t)$. Additionally, using sensor signals from multiple sensors such as S1 to S4 improves the baseline estimate (estimation signal) when working with non-ideal, non-point forces or multiple concurrent forces.

Another example of further arguments includes the magnitude as a function of the elapsed time of a sensor signal obtained from at least one other sensor of the system which might not be a force sensor. For example, a temperature signal Temperature(t) obtained from a temperature sensor could be used as follows:

$$F_{corrected}(t) = F(t) - B(F(t), \text{Temperature}(t))$$

Another possible technique is to calculate the estimation signal differently for different magnitudes of the sensor signal and/or of the corrected signal. This may, for example, be useful in low SNR environments.

By way of example, the estimation signal or estimated baseline signal may be calculated as under three different operating regimes R1 to R3 as follows, with the estimation signal termed $B_{final}(t)$ and referred to here as a compensation signal for ease of understanding:

To determine the operating regime, the corrected signal (i.e. the sensor signal corrected for mechanical relaxation effects) may be calculated as earlier according to:

$$F_{corrected}(t) = F(t) - B(t)$$

and $F_{corrected}(t)$ then compared to an upper, $\text{Threshold}_{Upper}$, and lower, $\text{Threshold}_{Lower}$, threshold.

The three regimes R1 to R3 may then be defined as:

$F_{corrected}(t) > \text{Threshold}_{Upper}$      R1:

$\text{Threshold}_{Lower} < F_{corrected}(t) < \text{Threshold}_{Upper}$      R2:

$\text{Threshold}_{Lower} > F_{corrected}(t)$      R3:

In regime R1, the compensation signal $B_{final}(t)$ may be calculated as:

$$B_{final}(t) = B(t)$$

That is, the compensation signal in this case is the estimation signal calculated as described earlier.

In regime R2, the compensation signal $B_{final}(t)$ may be calculated as:

$$B_{final}(t)=\alpha(t)B(t)+(1-\alpha(t))F(t)$$

where $$\alpha(t) = \frac{F_{corrected}(t)}{\text{Threshold}_{Upper} - \text{Threshold}_{Lower}} - \frac{\text{Threshold}_{Lower}}{\text{Threshold}_{Upper} - \text{Threshold}_{Lower}}$$

In this case, the compensation signal corresponds to a linear combination of B(t) and F(t). This regime ensures that $F_{corrected}(t)$ does not have discontinuities when switching between regimes R1 and R3.

In regime R3, the compensation signal $B_{final}(t)$ may be calculated as:

$$B_{final}=F(t)$$

In this case, the compensation signal (baseline) corresponds exclusively to the sensor signal without any baseline correction.

Figure 11:
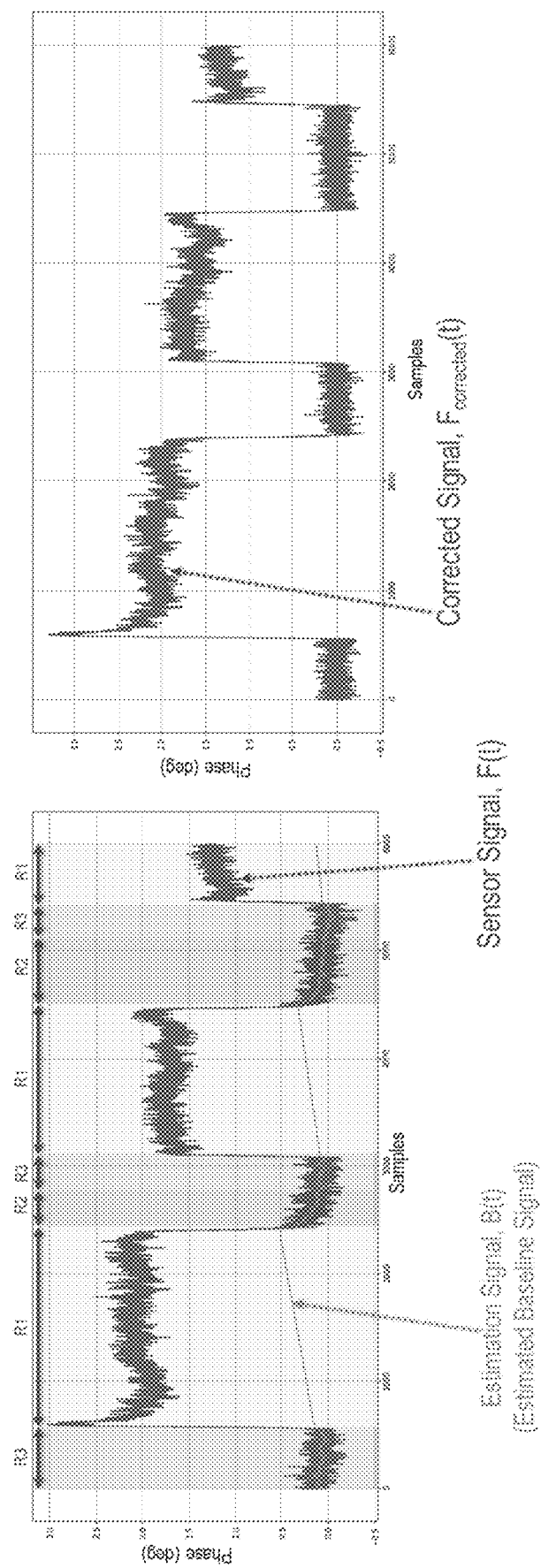
FIG. 11 presents graphs useful for understanding possible operation of the embodiments of FIGS. 7 and 8.

FIG. 11 corresponds to FIG. 9, with the corrected signal $F_{corrected}(t)$ calculated according to the regimes R1 to R3 as described above, and with the period of time in which the different regimes are operational explicitly indicated in the left-hand graph.

In fact, although not mentioned earlier, the corrected signal $F_{corrected}(t)$ in FIG. 9 was also calculated according to the regimes R1 to R3 so that the only difference between FIG. 11 and FIG. 9 is the explicit labelling of R1 to R3. Thus, the mention of B(t) in FIG. 9 could be interpreted as corresponding to $B_{final}(t)$.

In regime R1, the button is being pressed and the baseline estimate (compensation signal, also the estimation signal) is increasing, proportionally to both the duration and force of the press in line with FIG. 9. In regime R3 the sensor signal is close to the noise floor and mechanical relaxation has negligible effect, so the baseline estimate (compensation signal) is based exclusively on the sensor signal (phase signal). Incidentally, in this example, low pass filtering has been applied to the F(t) signal when calculating $B_{final}(t)=F(t)$. This means, the curves of F(t) and $B_{final}(t)$ do not exactly overlap. Regime R2 is a transition between regimes R1 and R3, and the baseline estimate (compensation signal) consists of a linear combination of the baseline estimate (compensation signal) calculated using regimes R1 and R3.

Figure 12:
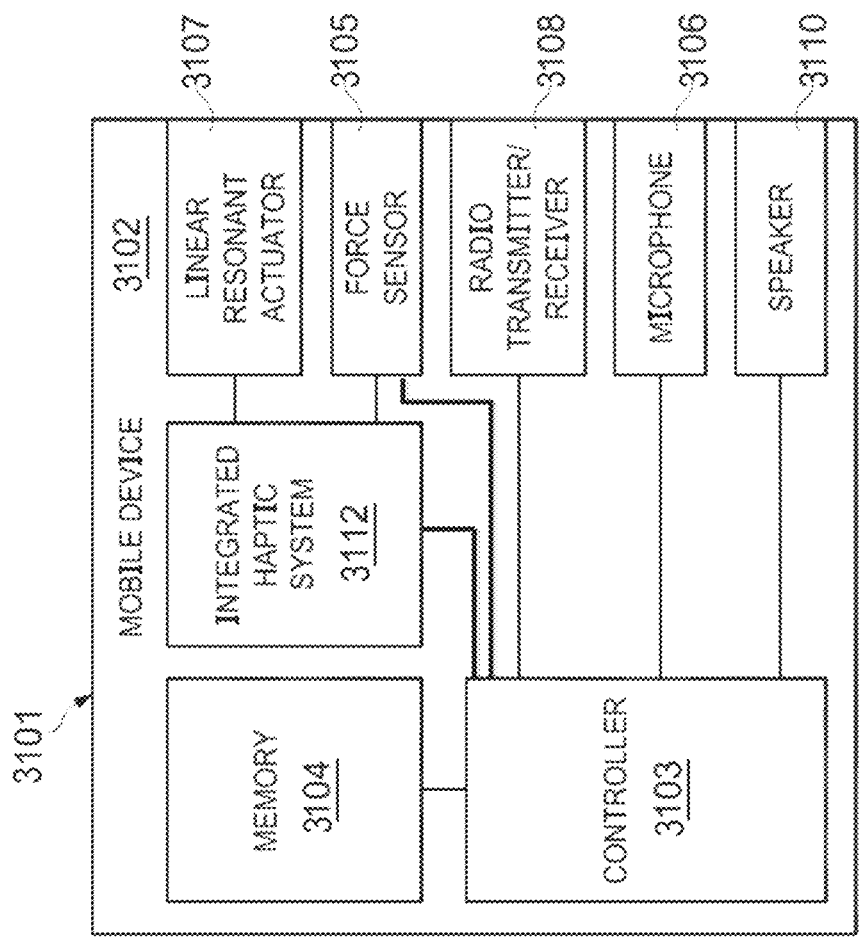
FIG. 12 is a block diagram of selected components of an example host device in which embodiments of the present invention may be deployed.

As mentioned above, the sensor systems disclosed herein may be embodied as (or as a part of) a host device, such as a mobile device. FIG. 12 illustrates a block diagram of selected components of an example mobile device (host device) 3102, in accordance with embodiments of the present disclosure.

As shown in FIG. 12, mobile device 3102 may comprise an enclosure 3101, a controller 3103, a memory 3104, a force sensor or force sensor 3105, a microphone 3106, a linear resonant actuator (LRA) 3107, a radio transmitter/receiver 3108, a speaker 3110, and an integrated haptic system 3112. It will be understood that any suitable vibrational actuators arranged to provide a haptic vibration effect (e.g., rotational actuators such as ERMs, vibrating motors, etc.) may be used as an alternative to or in addition to the LRA 3107.

Figure 1:
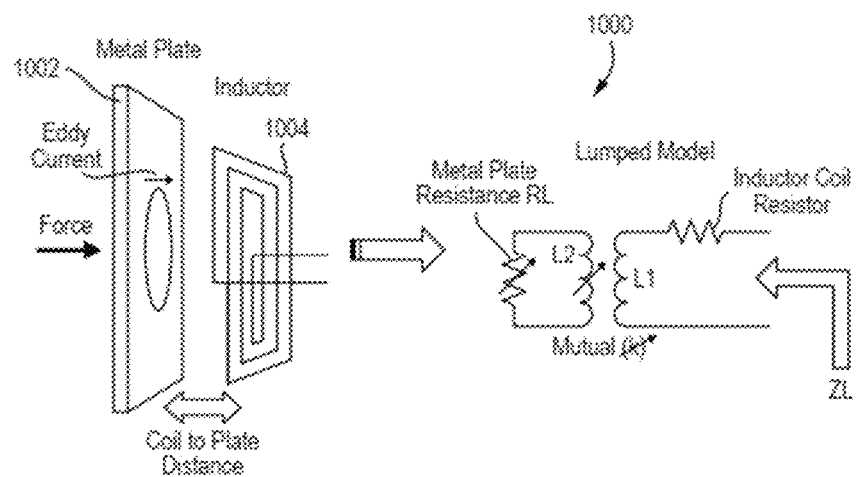
FIG. 1, mentioned above, is a schematic diagram of an example previously-considered inductive (force) sensor system.
Figure 2:
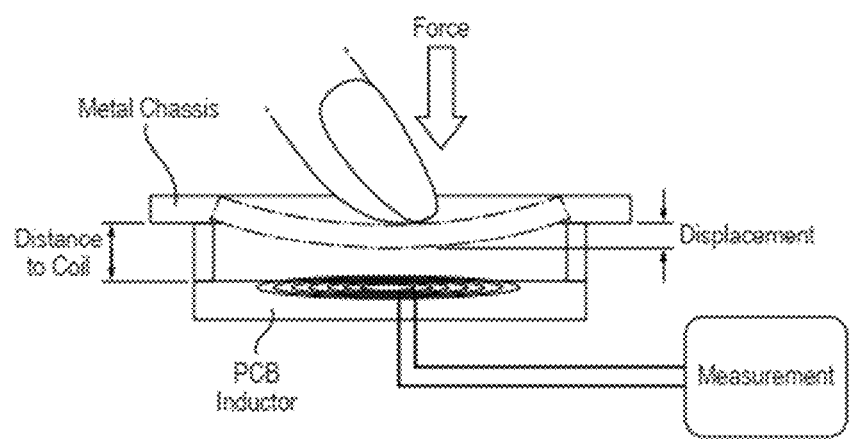
FIG. 2, mentioned above, is a schematic diagram of an example previously-considered inductive sensor system, showing structural implementation.

Enclosure 3101 may comprise any suitable housing, casing, or other enclosure for housing the various components of mobile device (host device) 3102. Enclosure 3101 may be constructed from plastic, metal, and/or any other suitable materials. In addition, enclosure 3101 may be adapted (e.g., sized and shaped) such that mobile device 3102 is readily transported on a person of a user of mobile device 3102. Accordingly, mobile device 3102 may include but is not limited to a smart phone, a tablet computing device, a handheld computing device, a personal digital assistant, a notebook computer, a video game controller, a headphone or earphone or any other device that may be readily transported on a person of a user of mobile device 3102. While FIG. 1 illustrates a mobile device, it will be understood that the illustrated systems may be utilized in other device types, e.g. user-interactable (user-interactive) display technology, automotive computing systems, etc.

Controller 3103 may be housed within enclosure 3101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 3103 interprets and/or executes program instructions and/or processes data stored in memory 3104 and/or other computer-readable media accessible to controller 3103.

Memory 3104 may be housed within enclosure 3101, may be communicatively coupled to controller 3103, and may include any system, device, or apparatus configured to retain program instructions and/or data for a period of time (e.g., computer-readable media). Memory 3104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 3102 is turned off.

Microphone 3106 may be housed at least partially within enclosure 3101, may be communicatively coupled to controller 3103, and may comprise any system, device, or apparatus configured to convert sound incident at microphone 3106 to an electrical signal that may be processed by controller 3103, wherein such sound is converted to an electrical signal using a diaphragm or membrane having an electrical capacitance that varies as based on sonic vibrations received at the diaphragm or membrane. Microphone 3106 may include an electrostatic microphone, a condenser microphone, an electret microphone, a microelectromechanical systems (MEMS) microphone, or any other suitable capacitive microphone.

Radio transmitter/receiver 3108 may be housed within enclosure 3101, may be communicatively coupled to controller 3103, and may include any system, device, or apparatus configured to, with the aid of an antenna, generate and transmit radio-frequency signals as well as receive radio-frequency signals and convert the information carried by such received signals into a form usable by controller 3103. Radio transmitter/receiver 3108 may be configured to transmit and/or receive various types of radio-frequency signals, including without limitation, cellular communications (e.g., 2G, 3G, 4G, 5G, LTE, etc.), short-range wireless communications (e.g., BLUETOOTH), commercial radio signals, television signals, satellite radio signals (e.g., GPS), Wireless Fidelity, etc.

A speaker 3110 may be housed at least partially within enclosure 3101 or may be external to enclosure 3101, may be communicatively coupled to controller 3103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from the amplifier.

The force sensor 3105 may be housed within, be located on or form part of the enclosure 3101, and may be communicatively coupled to the controller 3103 as shown. It will be understood that force sensor 3105 may be representative of a single force sensor or of a plurality of force sensors. Each force sensor 105 may include any suitable system, device, or apparatus for sensing a force, a pressure, or a touch (e.g., an interaction with a human finger) and for generating an electrical or electronic signal in response to such force, pressure, or touch. In some embodiments, such electrical or electronic signal may be a function of a magnitude of the force, pressure, or touch applied to the force sensor. In these and other embodiments, such electronic or electrical signal may comprise a general-purpose input/output signal (GPIO) associated with an input signal to which haptic feedback is given.

Example force sensors 3105 may include or comprise: capacitive displacement sensors, inductive force sensors, strain gauges, piezoelectric force sensors, force sensing resistors, piezoresistive force sensors, thin film force sensors, and quantum tunneling composite-based force sensors.

In some arrangements, other types of sensor may be employed. For purposes of clarity and exposition in this disclosure, the term "force" as used herein may refer not only to force, but to physical quantities indicative of force or analogous to force, such as, but not limited to, pressure and touch.

Linear resonant actuator 3107 may be housed within enclosure 3101, and may include any suitable system, device, or apparatus for producing an oscillating mechanical force across a single axis. For example, in some embodiments, linear resonant actuator 3107 may rely on an alternating current voltage to drive a voice coil pressed against a moving mass connected to a spring. When the voice coil is driven at the resonant frequency of the spring, linear resonant actuator 3107 may vibrate with a perceptible force. Thus, linear resonant actuator 3107 may be useful in haptic applications within a specific frequency range.

While, for the purposes of clarity and exposition, this disclosure is described in relation to the use of linear resonant actuator 3107, it is understood that any other type or types of vibrational actuators (e.g., eccentric rotating mass actuators) may be used in lieu of or in addition to linear resonant actuator 3107. In addition, it is also understood that actuators arranged to produce an oscillating mechanical force across multiple axes may be used in lieu of or in addition to linear resonant actuator 3107. A linear resonant actuator 3107, based on a signal received from integrated haptic system 3112, may render haptic feedback to a user of mobile device 3102 for at least one of mechanical button replacement and capacitive sensor feedback.

Integrated haptic system 3112 may be housed within enclosure 3101, may be communicatively coupled to force sensor 3105 and linear resonant actuator 3107, and may include any system, device, or apparatus configured to receive a signal from force sensor 3105 indicative of a force applied to mobile device 3102 (e.g., a force applied by a human finger to a virtual button of mobile device 3102) and generate an electronic signal for driving linear resonant actuator 3107 in response to the force applied to mobile device 3102. Integrated haptic system 3112 may be communicatively coupled to the controller 3103 as shown, and may for example be controlled by the controller 3103.

Although specific example components are depicted above as being integral to mobile device 3102 (e.g., controller 3103, memory 3104, force sensor 3105, microphone 3106, radio transmitter/receiver 3108, speakers(s) 3110), a mobile device 3102 in accordance with this disclosure may comprise one or more components not specifically enumerated above. For example, although FIG. 1 depicts certain user interface components, mobile device 3102 may include one or more other user interface components in addition to those depicted in the above figure, including but not limited to a keypad, a touch screen, and a display, thus allowing a user to interact with and/or otherwise manipulate mobile device 3102 and its associated components.

In addition, it will be understood that the device may be provided with additional input sensor devices or transducers, for example accelerometers, gyroscopes, cameras, temperature sensors or other sensor devices.

It will be appreciated that the force sensor 3105 may be considered equivalent to the force sensor 2010, and that the correction unit 2020 may be implemented in the integrated haptic system 3112 and/or the controller 3103. Similarly, the button press detection block (input determination block) 1160 may be implemented in the integrated haptic system 3112 and/or the controller 3103.

As described herein, correction of the sensor signal (to generate the correction signal) may be referred to as adjustment, adaptation, alteration, or modification. The corrected signal may be referred to as an adjusted signal or modified signal, for example. The correction unit may be referred to as an adjustment, adaptation, alteration, or modification unit, for example.

The skilled person will recognise that some aspects of the above described apparatus (circuitry) and methods may be embodied as processor control code, for example on a non-volatile carrier medium such as a disk, CD- or DVD-ROM, programmed memory such as read only memory (Firmware), or on a data carrier such as an optical or electrical signal carrier. For example, the correction unit 2020 may be implemented as a processor operating based on processor control code. As another example, the integrated haptic system 3112 and/or the controller 3103 may be implemented as a processor operating based on processor control code. As another example, the processing block 1150 may be implemented as a processor operating based on processor control code.

For some applications, such aspects will be implemented on a DSP (Digital Signal Processor), ASIC (Application Specific Integrated Circuit) or FPGA (Field Programmable Gate Array). Thus the code may comprise conventional program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communication with one another. Where appropriate, such aspects may also be implemented using code running on a field-(re)programmable analogue array or similar device in order to configure analogue hardware.

Some embodiments of the present invention may be arranged as part of an audio processing circuit, for instance an audio circuit (such as a codec or the like) which may be provided in a host device as discussed above. A circuit or circuitry according to an embodiment of the present invention may be implemented (at least in part) as an integrated circuit (IC), for example on an IC chip. One or more input or output transducers (such as force sensor 2010 or 3105) may be connected to the integrated circuit in use.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office (USPTO) and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A correction unit for use in a sensor system, the sensor system comprising a force sensor configured to output a sensor signal indicative of a temporary mechanical distortion of a material under an applied force, the correction unit configured, based on the sensor signal, to:
    measure an elapsed time from a start of a user press operation when a user applies a force to the force sensor, the start of the user press operation defined by when the sensor signal crosses or exceeds a threshold value as it rises from a value below the threshold value;
    calculate an estimation signal which estimates an effect of the applied force on how the material will return towards an undistorted form upon a substantial reduction or removal of the applied force, wherein the estimation signal is calculated to rise during the user press operation with its value dependent on the elapsed time; and
    generate a corrected signal based on the estimation signal;
    wherein the correction unit is configured, based on a determinative magnitude being a magnitude of the sensor signal or the corrected signal, to calculate a compensation signal as:
        when the determinative magnitude is above a first threshold, the estimation signal;
        when the determinative magnitude is below a second threshold, the sensor signal; and
        when the determinative magnitude is between the first and second thresholds, a weighted sum of the sensor signal and the estimation signal dependent on a position of the determinative magnitude between the first and second thresholds; and
    wherein:
        the compensation signal is an estimated baseline signal; and
        the correction unit is configured to generate the corrected signal by subtracting the estimated baseline signal from the sensor signal, including at the end of the user press operation when the sensor signal value drops rapidly as the applied force is substantially reduced or removed,
        whereby the sensor signal need drop less far to meet the estimated baseline signal at the end of the user press operation than if the estimation signal were not calculated to rise during the user press operation dependent on the elapsed time.

2. The correction unit as claimed in claim 1, wherein the effect comprises a mechanical effect, or a mechanical-relaxation effect, affecting how the material will return towards the undistorted form.

3. The correction unit as claimed in claim 1, configured to estimate the effect based on a definition of a mechanical model which models a mechanical interaction between the material and the applied force.

4. The correction unit as claimed in claim 1, wherein:
the sensor signal represents the applied force; and/or
the corrected signal is generated by correcting the sensor signal based on the estimation; and/or
the corrected signal better represents the applied force than the sensor signal, optionally when that applied force is applied and/or when that applied force is substantially reduced or removed.

5. The correction unit as claimed in claim 1, wherein the force is applied and subsequently reduced or removed in a user press operation, the user press operation starting when the force is detected as having been applied.

6. The correction unit as claimed in claim 5, configured, based on the sensor signal, to detect the start of the user press operation, optionally by comparing the sensor signal to a threshold value.

7. The correction unit as claimed in claim 5, configured to calculate the estimation signal using an estimation model whose arguments comprise one or more input variables, the one or more input variables comprising one or more of:
time;
an elapsed time of the user press operation;
a magnitude of the sensor signal;
a rate of change of the magnitude of the sensor signal;
a period of time since a previous user press operation;
a frequency of user press operations;
a determined location of the applied force relative to a location of the force sensor;
a time-domain and/or frequency-domain feature extracted from the sensor signal and/or the corrected signal;
a time-domain and/or frequency-domain feature extracted from, or a magnitude of, at least one sensor signal obtained from another force sensor of the sensor system;
a time-domain and/or frequency-domain feature extracted from, or a magnitude of, at least one sensor signal obtained from another sensor of the sensor system such as a temperature sensor, accelerometer, microphone or camera;
a feedback signal generated by the sensor system in response to the sensor signal and/or the corrected signal; and
a feedback signal input by a user in response to the sensor signal and/or the corrected signal.

8. The correction unit as claimed in claim 7, wherein the estimation model is configured such that the estimation signal is related to or proportional to:
the elapsed time of the user press operation; and/or
the magnitude of the sensor signal.

9. The correction unit as claimed in claim 7, wherein the estimation model is or comprises an estimation function such as an exponential function.

10. The correction unit as claimed in claim 7, configured, based on the sensor signal, to calculate the estimation signal based on:

$$B(t) = F(t)\left(1 - \exp^{\frac{-t_E}{T_0}}\right)$$

where t is time, $t_E$ is the elapsed time, B(t) is the estimation signal, F(t) is the sensor signal, and $T_0$ is a time-constant factor.

11. The correction unit as claimed in claim 10, configured to adapt the time-constant factor To based on one or more of said input variables.

12. The correction unit as claimed in claim 7, configured, based on the sensor signal, to calculate the estimation signal based on a weighted sum or other mathematical combination of the sensor signal and said at least one sensor signal obtained from another force sensor of the sensor system.

13. The correction unit as claimed in claim 7, configured, based on the sensor signal, to calculate the estimation signal based on a weighted sum or other mathematical combination of the sensor signal and said at least one sensor signal obtained from another sensor of the sensor system such as a temperature sensor, accelerometer, microphone or camera.

14. The correction unit as claimed in claim 1, wherein:
the sensor signal comprises a time series of samples; and
the correction unit is configured to calculate the estimation signal and/or the correction signal on a sample-by-sample basis, optionally in an iterative manner.

15. The correction unit as claimed in claim 1, wherein:
the mechanical distortion comprises one or more of a mechanical deformation, an elastic deformation and a mechanical deflection; and/or
the force is a distorting force; and/or
the material is part of the force sensor.

16. A sensor system or a host device, comprising:
the correction unit as claimed in claim 1; and
the force sensor.

* * * * *

UNITED STATES PATENT AND TRADEMARK OFFICE
CERTIFICATE OF CORRECTION

PATENT NO. : 11,947,756 B2
APPLICATION NO. : 17/968565
DATED : April 2, 2024
INVENTOR(S) : Sanz-Robinson et al.

Page 1 of 1

It is certified that error appears in the above-identified patent and that said Letters Patent is hereby corrected as shown below:

In the Claims

In Column 20, Line 24, in Claim 11, delete "To" and insert -- $T_0$ --, therefor.

Signed and Sealed this
Twenty-second Day of October, 2024

Katherine Kelly Vidal
*Director of the United States Patent and Trademark Office*